(12) United States Patent
Ye et al.

(10) Patent No.: US 10,043,870 B2
(45) Date of Patent: Aug. 7, 2018

(54) METHOD AND STRUCTURE TO IMPROVE FILM STACK WITH SENSITIVE AND REACTIVE LAYERS

(71) Applicant: Applied Materials, Inc., Santa Clara, CA (US)

(72) Inventors: Zhiyuan Ye, San Jose, CA (US); Xinyu Bao, Fremont, CA (US); Errol Antonio C. Sanchez, Tracy, CA (US); David K. Carlson, San Jose, CA (US); Keun-Yong Ban, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/918,604

(22) Filed: Oct. 21, 2015

(65) Prior Publication Data

US 2016/0126322 A1 May 5, 2016

Related U.S. Application Data

(60) Provisional application No. 62/088,898, filed on Dec. 8, 2014, provisional application No. 62/072,925, filed on Oct. 30, 2014.

(51) Int. Cl.
*H01L 29/205* (2006.01)
*H01L 27/146* (2006.01)
*H01L 21/02* (2006.01)

(52) U.S. Cl.
CPC ........ *H01L 29/205* (2013.01); *H01L 21/0262* (2013.01); *H01L 21/02381* (2013.01); *H01L 21/02461* (2013.01); *H01L 21/02463* (2013.01); *H01L 21/02505* (2013.01); *H01L 21/02546* (2013.01); *H01L 21/02587* (2013.01)

(58) Field of Classification Search
CPC .................. H01L 29/205; H01L 27/14694
USPC .......................................... 257/190
See application file for complete search history.

(56) References Cited

U.S. PATENT DOCUMENTS

| 5,986,291 | A | 11/1999 | Currie et al. | |
| 9,318,561 | B2* | 4/2016 | Basu | H01L 21/02543 |
| 2001/0035530 | A1* | 11/2001 | Udagawa | C23C 16/455 257/79 |
| 2003/0034535 | A1* | 2/2003 | Barenburg | B81C 1/00246 257/415 |

(Continued)

FOREIGN PATENT DOCUMENTS

JP 2003-051509 A 2/2003

OTHER PUBLICATIONS

PCT Notification of Transmittal of the International Search Report and the Written Opinion of the International Searching Authority for International Application No. PCT/US2015/053236 dated Dec. 28, 2015; 11 total pages.

*Primary Examiner* — Moazzam Hossain
(74) *Attorney, Agent, or Firm* — Patterson + Sheridan LLP

(57) ABSTRACT

Embodiments of the present disclosure generally relate to a film stack including layers of group III-V semiconductor materials. The film stack includes a phosphorous containing layer deposited over a silicon substrate, a GaAs containing layer deposited on the phosphorous containing layer, and an aluminum containing layer deposited on the GaAs containing layer. The GaAs containing layer between the phosphorous containing layer and the aluminum containing layer improves the surface smoothness of the aluminum containing layer.

7 Claims, 1 Drawing Sheet

(56) References Cited

U.S. PATENT DOCUMENTS

| | | |
|---|---|---|
| 2007/0158684 A1 | 7/2007 | Kohiro et al. |
| 2007/0243703 A1 | 10/2007 | Pinnington et al. |
| 2008/0032478 A1* | 2/2008 | Hudait ............ H01L 21/02381 438/285 |
| 2008/0157058 A1* | 7/2008 | Hudait ............ H01L 21/02381 257/14 |
| 2009/0242873 A1 | 10/2009 | Pillarisetty et al. |
| 2013/0143038 A1* | 6/2013 | Leuther ............ H01L 21/02395 428/332 |
| 2014/0027708 A1* | 1/2014 | Goyal .................... H01L 29/15 257/9 |
| 2014/0209979 A1* | 7/2014 | Lau .................. H01L 21/02461 257/194 |
| 2014/0299885 A1* | 10/2014 | Lee ....................... H01L 29/20 257/76 |
| 2015/0207298 A1* | 7/2015 | Tsuji .................... H01S 5/2275 438/39 |
| 2015/0228730 A1* | 8/2015 | Yang .................... H01L 29/207 257/369 |
| 2015/0357793 A1* | 12/2015 | Mori .................... H01S 5/2275 372/44.01 |

* cited by examiner

US 10,043,870 B2

METHOD AND STRUCTURE TO IMPROVE FILM STACK WITH SENSITIVE AND REACTIVE LAYERS

CROSS-REFERENCE TO RELATED APPLICATIONS

This application claims priority to U.S. Provisional Patent Application Ser. No. 62/072,925, filed on Oct. 30, 2014 and U.S. Provisional Patent Application Ser. No. 62/088,898, filed on Dec. 8, 2014. Each of the aforementioned patent application is incorporated herein by reference.

BACKGROUND

Field

Embodiments of the present disclosure generally relate to semiconductor devices. More particularly, embodiments of the present disclosure relate to a film stack including layers of group III-V semiconductor materials.

Description of the Related Art

Group III-V semiconductor materials have been used for forming semiconductor devices, such as metal-oxide-semiconductor field-effect transistors (MOSFETs), due to high electron mobility and saturation velocity. Typically, a stack of films includes layers of group III-V semiconductor materials having different properties, such as lattice constant and band gap. The stack of films can form active layers having certain electrical or optical properties via strain or gap engineering. The transition between the layers of group III-V semiconductor materials in the film stack could be critical for the quality and performance of the film stack. It is even more so when a layer is metastable or reactive to the layer deposited thereon, or a layer is extremely sensitive to surface conditions of the layer on which the sensitive layer is to be deposited.

SUMMARY

Embodiments of the present disclosure generally relate to a film stack including layers of group III-V semiconductor materials. In one embodiment, the film stack is a buffer structure including a phosphorous containing layer deposited over a silicon substrate, a GaAs containing layer deposited on the phosphorous containing layer, and an aluminum containing layer deposited on the GaAs containing layer.

In another embodiment, a semiconductor device includes a buffer structure that includes an InP layer deposited over a silicon substrate, a first InGaAs layer deposited on the InP layer, and an InAlAs layer deposited on the first InGaAs layer. The semiconductor device further includes an active layer deposited on the buffer structure.

In another embodiment, a method for forming a buffer structure includes depositing a phosphorous containing layer over a silicon substrate, depositing a GaAs containing layer on the phosphorous containing layer, and depositing an aluminum containing layer on the GaAs containing layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a film stack including layers of group III-V semiconductor materials. In one embodiment, the film stack includes a phosphorous containing layer deposited over a silicon substrate, a GaAs containing layer deposited on the phosphorous containing layer, and an aluminum containing layer deposited on the GaAs containing layer. The GaAs containing layer between the phosphorous containing layer and the aluminum containing layer improves the surface smoothness of the aluminum containing layer.

Figure 1:
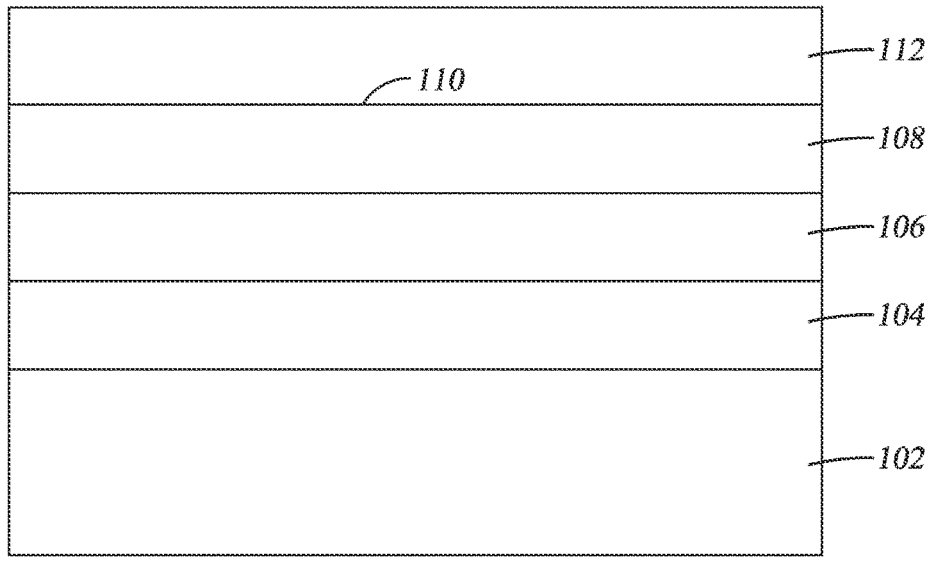
FIG. 1 schematically illustrates a film stack according to one embodiment.

FIG. 1 schematically illustrates a film stack 100 according to one embodiment. The film stack 100 includes a phosphorous containing layer 104 deposited over a silicon substrate 102, a GaAs containing layer 106 deposited on the phosphorous containing layer 104, and an aluminum containing layer 108 deposited on the GaAs containing layer 106. The phosphorous containing layer 104 is deposited on the silicon substrate 102, as shown in FIG. 1, however, other layers may be deposited between the phosphorous containing layer 104 and the silicon substrate 102, so the phosphorous containing layer 104 is deposited over the silicon substrate 102 without requiring direct contact. In one embodiment, the phosphorous containing layer 104 is an InP layer, the GaAs containing layer 106 is an InGaAs layer, and the aluminum containing layer 108 is an InAlAs layer.

Conventionally, an InAlAs layer is deposited directly on an InP layer, i.e., the InAlAs layer is in contact with the InP layer. It has been found that aluminum containing materials are very reactive and sensitive to phosphorous containing materials. The InP layer may start decompose when there is a break in phosphorous environment for longer than 3 seconds. For example, if a purge process to purge out the phosphorous containing gases is longer than 3 seconds, hillocks, or bumps, may be formed on an upper surface of the aluminum containing layer deposited on the phosphorous containing layer. The hillocks formed on the upper surface of the aluminum containing layer may cause problems for subsequent layers deposited on the upper surface of the aluminum containing layer. If the purge process is less than 3 seconds, InAlAsP layer may form which may degrade the quality of the film stack.

In order to form an aluminum containing layer having a smooth upper surface, a GaAs containing layer, such as the GaAs containing layer 106, is formed between the phosphorous containing layer 104 and the aluminum containing layer 108, as shown in FIG. 1. The GaAs containing layer 106 is not sensitive and not reactive to phosphorous containing materials or phosphorous environment. Thus, the transition from the phosphorous containing layer 104 to the GaAs containing layer 106 can withstand a break in phosphorous environment for up to 30 seconds without significant degradation of the quality of the film stack 100. The transition between the GaAs containing layer 106 and the aluminum containing layer 108 is smooth since both layers 106, 108 may be in arsenic environment. As shown in FIG. 1, an upper surface 110 of the aluminum containing layer 108 is smooth and has a root-mean-square roughness that is less than 20 Angstroms, due to the insertion of the GaAs containing layer 106 between the phosphorous containing layer 104 and the aluminum containing layer 108.

The phosphorous containing layer 104, the GaAs containing layer 106 and the aluminum containing layer 108 may be a buffer structure of any suitable semiconductor device, such as an nMOS device, an optical device, a high electron mobility transistor, or a MOSFET device. An active layer 112 may be formed on the smooth upper surface 110 of the aluminum containing layer 108. In one embodiment, the active layer 112 is a channel layer of an nMOS device, and the active layer 112 is an InGaAs layer. In another embodiment, the active layer 112 includes a plurality of alternating group III-V semiconductor layers, such as InGaAs and InAlAs layers, which form a superlattice structure. In another embodiment, the active layer 112 is an absorption layer of an optical device. The thicknesses of the layers 104, 106, 108, 112 may vary depending on the application. In one embodiment, the GaAs containing layer 106 may have a thickness ranging from about 10 nm to about 50 nm, the aluminum containing layer 108 may have a thickness ranging from about 20 nm to about 100 nm, and the InGaAs layer 112 has a thickness ranging from about 10 nm to about 100 nm.

The layers 104, 106, 108 may be deposited by any suitable deposition method, such as metal-oxide chemical vapor deposition (MOCVD). The precursor material for the layer 104 may be any suitable phosphorous containing material, such as phosphine, and the precursor material for the layer 106 may be any suitable arsenide containing material, such as arsine. The MOCVD process temperature may be up to 100 degrees Celsius or greater.

Figure 2:
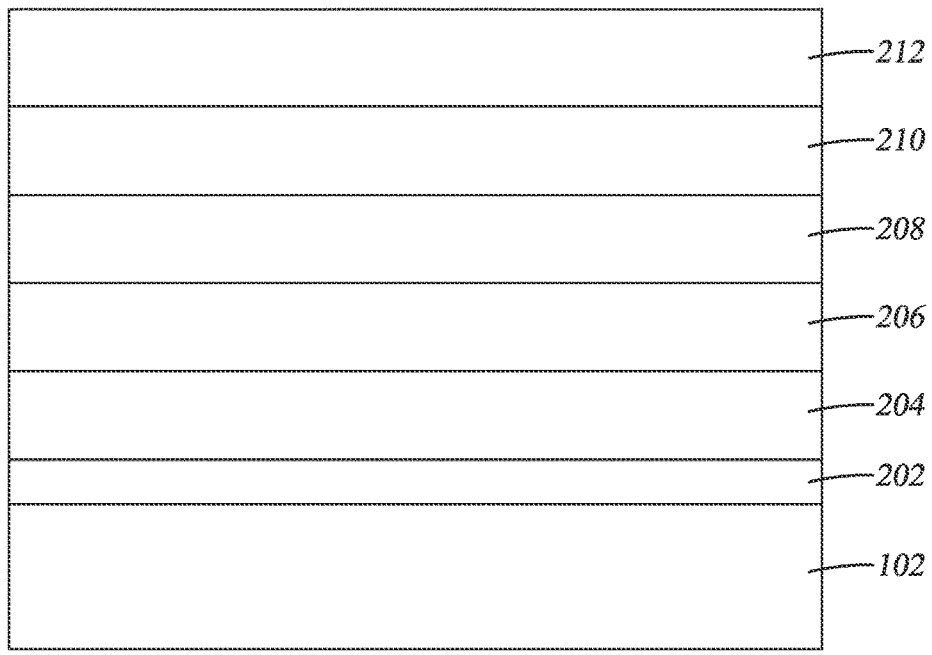
FIG. 2 schematically illustrates a film stack according to another embodiment.

FIG. 2 schematically illustrates a film stack 200 according to another embodiment. The film stack 200 may be a portion of a MOSFET structure. The film stack 200 includes a GaAs layer 204 deposited over the silicon substrate 102, an InP layer 206 deposited on the GaAs layer 204, an InGaAs layer 208 deposited on the InP layer 206, an InAlAs layer 210 deposited on the InGaAs layer 208, and a cap layer 212 deposited on the InAlAs layer 210. The InP layer 206 may be similar to the phosphorous containing layer 104, the InGaAs layer 208 may be similar to the GaAs containing layer 106, and the InAlAs layer 210 may be similar to the aluminum containing layer 108 described in FIG. 1. The cap layer 212 may be any suitable cap layer, such as an InP cap layer. In one embodiment, layers 204, 206, 208, 210, 212 of the film stack 200 are at least a portion of a buffer structure on a MOSFET structure. The cap layer 212 may be a sacrificial sealing layer allowing the transfer of the buffer structure, and the sacrificial seal may be removed so an active layer or structure may be deposited on the buffer structure.

The layers 204, 206, 208, 210, 212 of the film stack 200 may be deposited by any suitable deposition method, such as MOCVD. In one embodiment, the layers 204, 206, 208, 210, 212 are deposited in a MOCVD chamber. The MOCVD process of the GaAs layer 204 may be a two-step process. The first step may be depositing a seed layer at a lower temperature, such as ranging from about 325 degrees Celsius to about 425 degrees Celsius, and the process pressure for depositing the seeding layer may range from about 80 torr to about 600 torr, such as about 200 torr. Carrier flow rate may range from about 3 standard liter per minute (slm) to about 20 slm, such as about 10 slm. In one embodiment, trimethylgallium and tertiarybutylarsine are used as precursor materials. For the first step, the trimethylgallium may have a flow rate ranging from about 5 standard cubic centimeters per minute (sccm) to about 50 sccm, such as about 20 sccm and the tertiarybutylarsine may have a flow rate ranging from about 10 sccm to about 100 sccm, such as about 50 sccm. The thickness of the seed layer may range from about 5 nm to about 60 nm, such as 30 nm. The second step may be depositing a bulk layer at a higher temperature, such as from about 555 degrees Celsius to about 700 degrees Celsius, and the process pressure for depositing the bulk layer may range from about 5 torr to about 300 torr, such as from about 10 torr to about 80 torr. For the second step, the trimethylgallium may have a flow rate ranging from about 5 sccm to about 50 sccm, such as about 10 sccm and the tertiarybutylarsine may have a flow rate ranging from about 20 sccm to about 200 sccm, such as about 75 sccm. The bulk layer may have a thickness ranging from about 100 nm to about 800 nm, such as from about 200 nm to about 600 nm. The GaAs layer 204 may have a thickness ranging from about 105 nm to about 860 nm.

The MOCVD process of the InP layer 206 may be a two-step process. The first step may be depositing a seed layer at a lower temperature, such as ranging from about 360 degrees Celsius to about 500 degrees Celsius, and the process pressure for depositing the seeding layer may range from about 80 torr to about 600 torr, such as about 80 torr. Carrier flow rate may range from about 3 slm to about 20 slm, such as about 10 slm. In one embodiment, trimethylindium and tertiarybutylphosphine are used as precursor materials. For the first step, the trimethylindium may have a flow rate ranging from about 0.1 sccm to about 2 sccm, such as about 1 sccm and the ertiarybutylphosphine may have a flow rate ranging from about 10 sccm to about 300 sccm, such as about 50 sccm. The thickness of the seed layer may range from about 5 nm to about 60 nm, such as 30 nm. The second step may be depositing a bulk layer at a higher temperature, such as from about 500 degrees Celsius to about 650 degrees Celsius, and the process pressure for depositing the bulk layer may range from about 5 torr to about 300 torr, such as from about 10 torr to about 150 torr. For the second step, the trimethylindium may have a flow rate ranging from about 0.1 sccm to about 5 sccm, such as about 2 sccm and the tertiarybutylphosphine may have a flow rate ranging from about 10 sccm to about 500 sccm, such as about 50 sccm. The bulk layer may have a thickness ranging from about 100 nm to about 600 nm, such as from about 200 nm to about 400 nm. The InP layer 206 may have a thickness ranging from about 105 nm to about 660 nm.

In one embodiment, the GaAs layer 204 has a thickness of about 400 nm, the InP layer 206 has a thickness of about 300 nm, the InGaAs layer 208 has a thickness of about 20 nm, the InAlAs layer 210 has a thickness of about 50 nm, and the cap layer 212 has a thickness of about 10 nm.

As the processing chamber ages, contaminants may be released from chamber walls and contaminate the surface of a silicon substrate disposed therein. GaAs layers are sensitive to surface conditions and contaminations of the layer the GaAs layer is to be deposited on. As GaAs is a polar material and silicon is a non-polar material, depositing GaAs on the silicon substrate introduces anti-phase domains. In addition, there is a 4% lattice mismatch between the GaAs layer and the silicon substrate that causes high stress and high defective density at the interface between the GaAs layer and the silicon substrate. In order to reduce the sensitivity of the GaAs layer, a GaP layer may be deposited on the silicon substrate, and the GaAs layer is deposited on the GaP layer.

As shown in FIG. 2, a GaP layer 202 is deposited on the silicon substrate 102 and the GaAs layer 204 is deposited on the GaP layer 202. The GaP layer 202 is a polar material, which is similar to the GaAs layer 204, and the GaP layer 202 matches the lattice of the silicon substrate 102. Thus, having the GaP layer 202 sandwiched between the silicon substrate 102 and the GaAs layer 204, the sensitivity of the GaAs layer 204 is reduced. The GaP layer may be thin and has a thickness ranging from about 5 nm to about 60 nm, and may be deposited by any suitable deposition method.

A GaAs containing layer, such as an InGaAs layer, may be sandwiched between a phosphorous containing layer, such as an InP layer, and an aluminum containing layer, such as an InAlAs layer, to reduce hillocks formed on an upper surface of the aluminum containing layer. A GaP layer may be sandwiched between a silicon substrate and a GaAs layer to reduce the sensitivity of the GaAs layer.

While the foregoing is directed to embodiments of the present disclosure, other and further embodiments may be devised without departing from the basic scope thereof, and the scope thereof is determined by the claims that follow.

The invention claimed is:

1. A semiconductor device, comprising:
a buffer structure, including:
a GaP layer disposed over a silicon substrate;
a GaAs layer disposed on and in contact with the GaP layer;
an InP layer disposed on and in contact with the GaAs layer;
a first InGaAs layer disposed on and in contact with the InP layer; and
an InAlAs layer disposed on and in contact with the first InGaAs layer; and
a device layer disposed on and in contact with the InAlAs layer of the buffer structure, wherein the device layer is made of a material that is different from the InAlAs layer.

2. The semiconductor device of claim 1, wherein the device layer is a second InGaAs layer.

3. The semiconductor device of claim 1, wherein the device layer includes a plurality of alternating group III-V semiconductor layers.

4. The semiconductor device of claim 1, wherein the InP layer has a thickness ranging from about 105 nm to about 660 nm.

5. The semiconductor device of claim 1, wherein the GaAs layer has a thickness ranging from about 105 nm to about 860 nm.

6. The semiconductor device of claim 1, wherein the first InGaAs layer has a thickness ranging from about 10 nm to about 50 nm.

7. The semiconductor device of claim 1, wherein the InAlAs layer has a thickness ranging from about 20 nm to about 100 nm.

* * * * *